United States Patent
Wang et al.

(10) Patent No.: US 8,946,031 B2
(45) Date of Patent: Feb. 3, 2015

(54) METHOD FOR FABRICATING MOS DEVICE

(75) Inventors: Chih-Jung Wang, Hsinchu (TW);
Tong-Yu Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/353,227

(22) Filed: Jan. 18, 2012

(65) Prior Publication Data
US 2013/0183804 A1    Jul. 18, 2013

(51) Int. Cl.
*H01L 21/336* (2006.01)

(52) U.S. Cl.
USPC .......................................................... 438/285

(58) Field of Classification Search
CPC ...................... H01L 21/336; H01L 29/66803
USPC ............................ 257/288, 401; 438/151, 257
See application file for complete search history.

(56) References Cited

U.S. PATENT DOCUMENTS

| | | | |
|---|---|---|---|
| 6,043,138 A | 3/2000 | Ibok | |
| 6,150,209 A * | 11/2000 | Sun et al. | 438/240 |
| 6,368,915 B1 * | 4/2002 | Montree et al. | 438/257 |
| 6,448,142 B1 * | 9/2002 | Lai et al. | 438/303 |
| 6,492,216 B1 | 12/2002 | Yeo et al. | |
| 6,716,690 B1 | 4/2004 | Wang et al. | |
| 6,743,682 B2 * | 6/2004 | Woerlee et al. | 438/291 |
| 6,921,963 B2 | 7/2005 | Krivokapic et al. | |
| 7,087,477 B2 | 8/2006 | Fried et al. | |
| 7,091,551 B1 | 8/2006 | Anderson et al. | |
| 7,141,856 B2 * | 11/2006 | Lee et al. | 257/401 |
| 7,247,887 B2 | 7/2007 | King et al. | |
| 7,250,658 B2 | 7/2007 | Doris et al. | |
| 7,309,626 B2 | 12/2007 | Ieong et al. | |
| 7,352,034 B2 | 4/2008 | Booth, Jr. et al. | |
| 7,449,373 B2 | 11/2008 | Doyle et al. | |
| 7,470,570 B2 | 12/2008 | Beintner et al. | |
| 7,494,862 B2 | 2/2009 | Doyle et al. | |
| 7,531,437 B2 | 5/2009 | Brask et al. | |
| 7,569,857 B2 | 8/2009 | Simon et al. | |
| 8,310,013 B2 * | 11/2012 | Lin et al. | 257/401 |
| 8,426,283 B1 * | 4/2013 | Wang et al. | 438/299 |
| 2001/0011740 A1 * | 8/2001 | Deboer et al. | 257/306 |
| 2003/0062525 A1 * | 4/2003 | Parikh et al. | 257/73 |
| 2004/0195624 A1 | 10/2004 | Liu et al. | |
| 2005/0051825 A1 * | 3/2005 | Fujiwara et al. | 257/308 |
| 2006/0081895 A1 * | 4/2006 | Lee et al. | 257/288 |
| 2006/0099830 A1 | 5/2006 | Walther et al. | |
| 2006/0286729 A1 | 12/2006 | Kavalieros et al. | |
| 2007/0020896 A1 * | 1/2007 | Inoue et al. | 438/513 |
| 2007/0052039 A1 * | 3/2007 | Iinuma et al. | 257/384 |
| 2007/0108528 A1 | 5/2007 | Anderson et al. | |
| 2007/0158756 A1 | 7/2007 | Dreeskornfeld et al. | |
| 2008/0157208 A1 | 7/2008 | Fischer et al. | |

(Continued)

*Primary Examiner* — Vongsavanh Sengdara
*Assistant Examiner* — Ismail Muse
(74) *Attorney, Agent, or Firm* — J.C. Patents (57) ABSTRACT

A method for fabricating a MOS device is described. A first hard mask layer is formed over a substrate. The first hard mask layer is patterned and a portion of the substrate removed to form a first patterned hard mask, and a fin structure surrounded by a trench and extending in a first direction. An insulating layer is formed at the trench bottom. A gate conductive layer is formed on the insulating layer, extending in a second direction. A first implant process is performed using the first patterned hard mask as a mask to form first S/D extension regions in the sidewalls of the fin structure. The first patterned hard mask is removed to expose the top of the fin structure, and then a second implant process is performed to form second S/D extension region therein.

8 Claims, 13 Drawing Sheets

(56) References Cited

U.S. PATENT DOCUMENTS

| | | | |
|---|---|---|---|
| 2008/0274600 A1* | 11/2008 | Mathew et al. | 438/283 |
| 2009/0026553 A1* | 1/2009 | Bhuwalka et al. | 257/402 |
| 2009/0124097 A1 | 5/2009 | Cheng | |
| 2009/0242964 A1 | 10/2009 | Akil et al. | |
| 2009/0269916 A1 | 10/2009 | Kang et al. | |
| 2010/0048027 A1 | 2/2010 | Cheng et al. | |
| 2010/0072553 A1 | 3/2010 | Xu et al. | |
| 2010/0144121 A1 | 6/2010 | Chang et al. | |
| 2010/0167506 A1 | 7/2010 | Lin et al. | |
| 2011/0024841 A1* | 2/2011 | Yang et al. | 257/347 |
| 2011/0062443 A1* | 3/2011 | Maszara | 257/57 |
| 2012/0241864 A1* | 9/2012 | Gerhardt et al. | 257/368 |

* cited by examiner

METHOD FOR FABRICATING MOS DEVICE

BACKGROUND OF THE INVENTION

1. Field of Invention

This invention relates to a semiconductor process, and more particularly relates to a method for fabricating a metal-oxide-semiconductor (MOS) device.

2. Description of Related Art

MOS is a basic structure widely applied to various semiconductor devices, such as memory devices, image sensors and display devices.

The traditional MOS transistor is difficult to scale down due to the limitation of the fabricating process, so multi-gate transistors with better properties are developed. One example is the fin field-effect transistor (FinFET), which has a 3D gate structure to enhance the control on the channel and inhibit the leakage caused by the punch-through effect, and hence has a higher gate control ability than the conventional MOS transistor.

However, in current FinFET process, the implant angle of the implant process for forming the source/drain (S/D) extension regions and the halo regions is much limited, so the process margin is very small. Moreover, the S/D extension and the halo regions thus formed are uneven in dopant concentration and depth, and even cause leakage.

SUMMARY OF THE INVENTION

Accordingly, this invention provides a method for fabricating a MOS device, which allows the S/D extension regions and the halo regions to be formed in a uniform dopant concentration and a uniform depth and thus improve the process margin of the implant process of the S/D extension regions and the halo regions.

The method for fabricating a MOS device of this invention is described below. A first hard mask layer is formed over a semiconductor substrate. The first hard mask layer is patterned and a portion of the substrate removed to form a first patterned hard mask and a fin structure surrounded by a trench, wherein the fin structure extends in a first direction. An insulating layer is formed at the bottom of the trench. A gate conductive layer is formed on the insulating layer in the trench, extending in a second direction. A first implant process is performed with the first patterned hard mask as a mask to form first S/D extension regions in the sidewalls of the fin structure. The first patterned hard mask is removed to expose the top of the fin. A second implant process is performed to form second S/D extension regions in the top of the fin structure.

The above method may further include: performing a $1^{st}$ halo implant process before or after the $1^{st}$ implant process to form $1^{st}$ pocket doped regions in the sidewalls of the fin structure, and performing a $2^{nd}$ halo implant process before or after the $2^{nd}$ implant process to form $2^{nd}$ pocket doped regions in the top of the fin structure.

In an embodiment, the gate conductive layer is formed with the following steps. A conductive material layer is formed on the insulating layer in the trench and then planarized using the first patterned hard mask as a stop layer. A second hard mask layer is formed on the conductive material layer, and then the second hard mask layer and the conductive material layer are patterned into a second patterned hard mask and the gate conductive layer, respectively.

In another embodiment, the gate conductive layer is formed with the following steps. A conductive material layer is formed on the insulating layer in the trench. The conductive material layer is planarized, wherein the top surface of the remaining conductive material layer is higher than that of the first patterned hard mask. The conductive material layer is then patterned into the gate conductive layer.

Since the implanted regions in the first (halo) implant process and the second (halo) implant process are different and the doses of the two processes can be controlled independently, the S/D extension regions (and the halo regions) each can be formed in a uniform dopant concentration and a uniform depth. Moreover, the implant angle of the first (halo) implant process is not much limited, so the process margin can be improved.

In order to make the aforementioned and other objects, features and advantages of the present invention comprehensible, a preferred embodiment accompanied with figures is described in detail below.

BRIEF DESCRIPTION OF THE DRAWINGS

FIGS. 5A-7A are perspective views of the structures shown in FIGS. 5-7.

FIGS. 9A-11A are perspective views of the structures shown in FIGS. 9-11.

DESCRIPTION OF EMBODIMENTS

FIGS. 1-7 illustrate, in a side view along the first direction, a method for fabricating a MOS device according to an embodiment of this invention.

Figure 5:
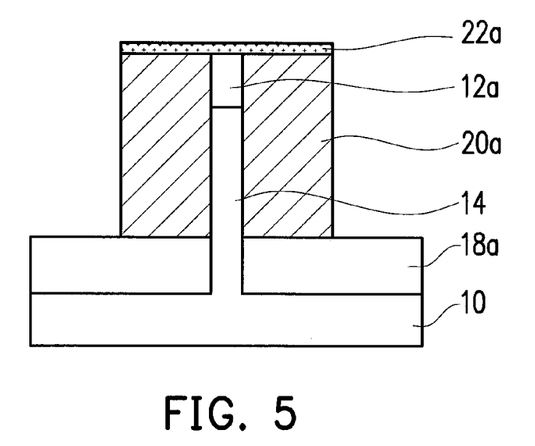
Figure 5A:
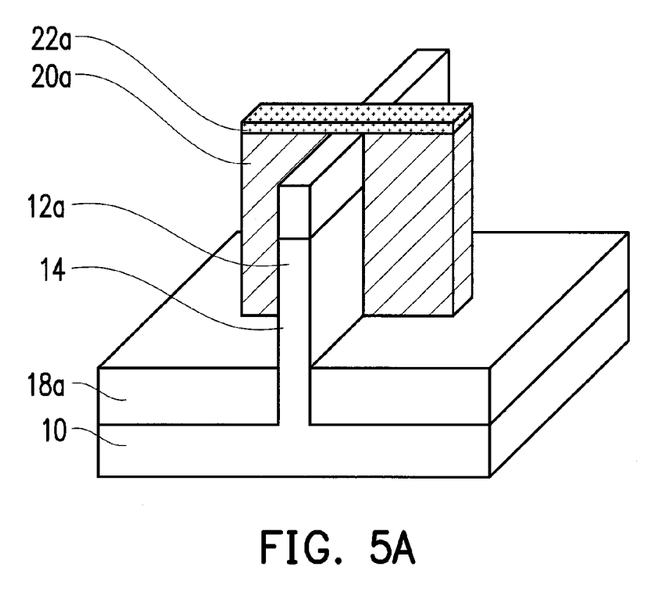
Figure 6:
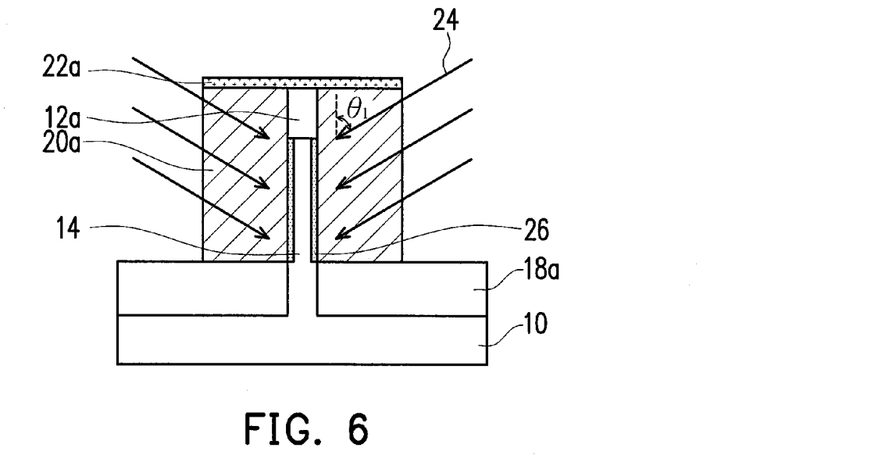
Figure 6A:
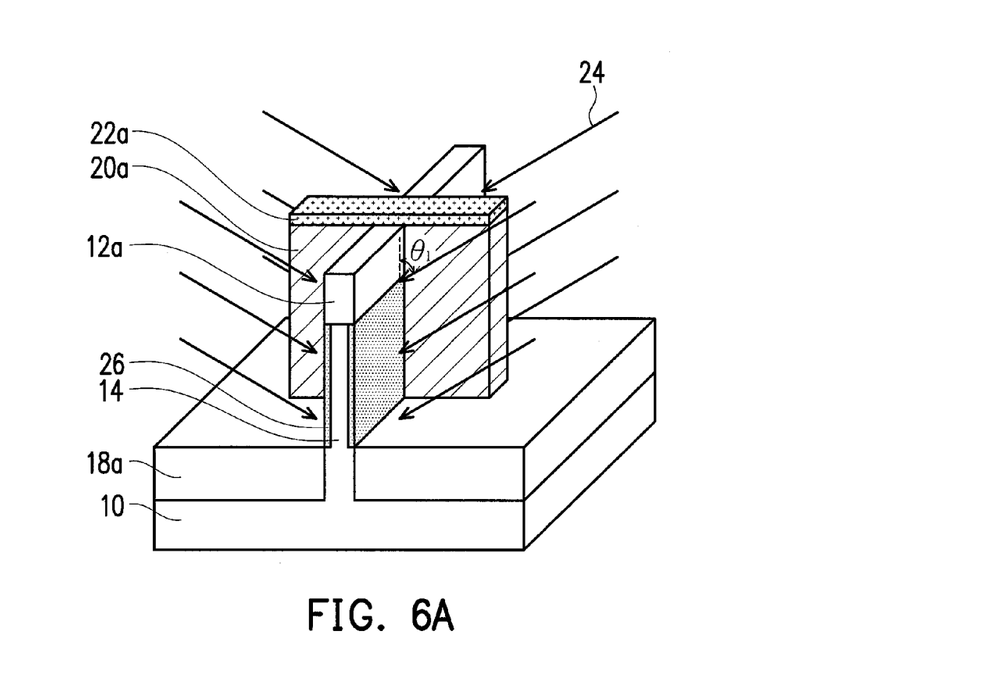
Figure 7:
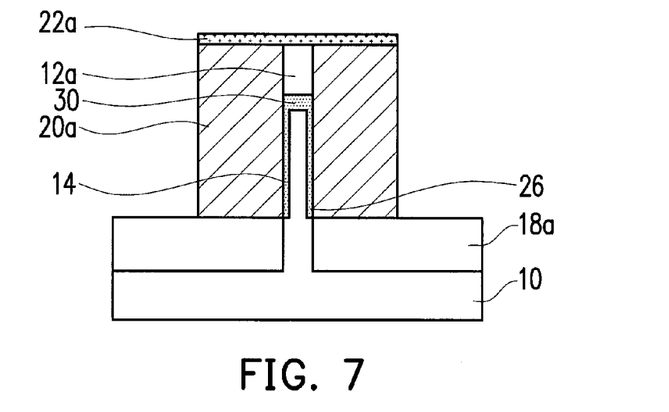

FIGS. 5A-7A are perspective views of the structures shown in FIGS. 5-7.

Figure 1:
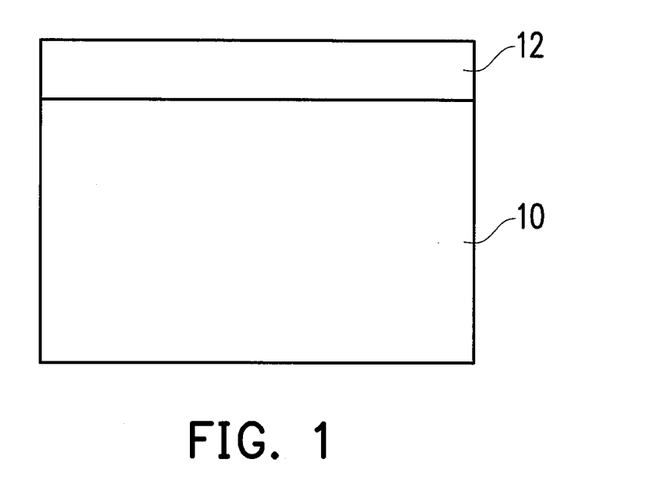
FIGS. 1-7 illustrate, in a side view along the first direction, a method for fabricating a MOS device according to an embodiment of this invention.

Referring to FIG. 1, a hard mask material layer 12 is formed over the substrate 10. The substrate 10 may include a semiconductor material, such as silicon. The hard mask material layer 12 may be a single material layer or include two or more material layers. In an embodiment, the hard mask material layer 12 includes a silicon dioxide ($SiO_2$) layer and a silicon nitride (SiN) layer thereon. The $SiO_2$ layer and the SiN layer can be formed by CVD. The $SiO_2$ layer may have a thickness of 20-200 angstroms. The SiN layer may have a thickness of 500-3000 angstroms.

Figure 2:
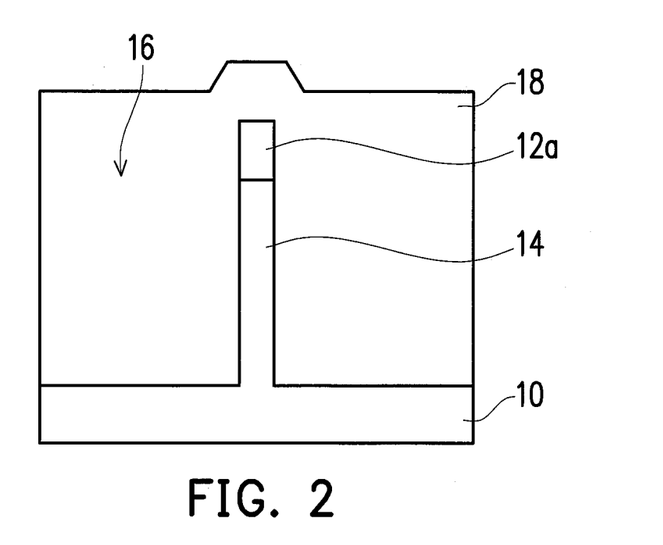

Referring to FIG. 2, lithography and etching processes are performed to pattern the hard mask material layer 12 and remove a portion of the substrate 10, forming a fin structure 14 surrounded by a trench 16 and extending in a first direction, and a patterned hard mask 12a. An insulating material layer 18 is then formed over the substrate 10, possibly including silicon oxide and possibly being formed by CVD.

Figure 3:
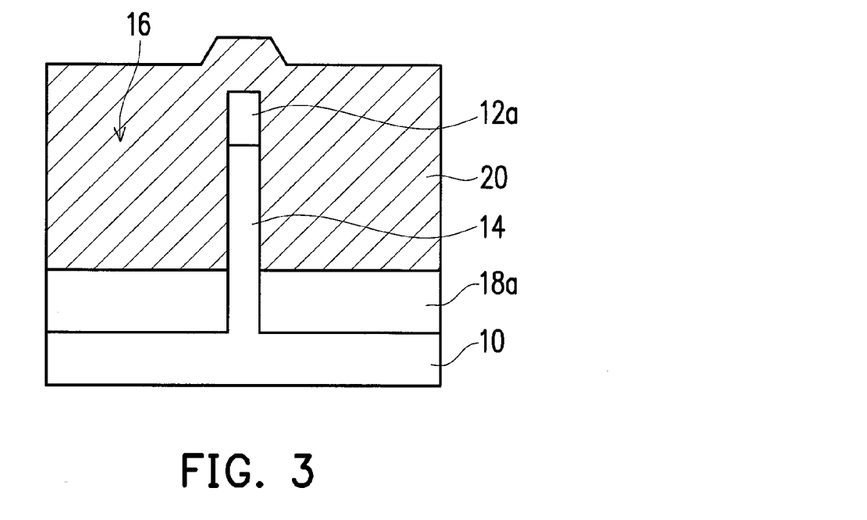

Referring to FIG. 3, a planarization process, such as a chemical mechanical polishing (CMP) process, is performed using the patterned hard mask 12a as a stop layer to remove the portion of the insulating material layer 18 over the patterned hard mask 12a. A portion of the remaining insulating material layer 18 in the trench 16 is then removed, leaving the insulating material layer 18 at the bottom of the trench 16 as an insulating layer 18a for device isolation. A conductive material layer 20 is then formed on the insulating layer 18a in the trench 16. The layer 20 may include single-crystal silicon, undoped poly-Si, doped poly-Si, amorphous silicon, SiGe, or a combination thereof, may be formed by CVD, and may be 500-2000 angstroms thick.

Figure 4:
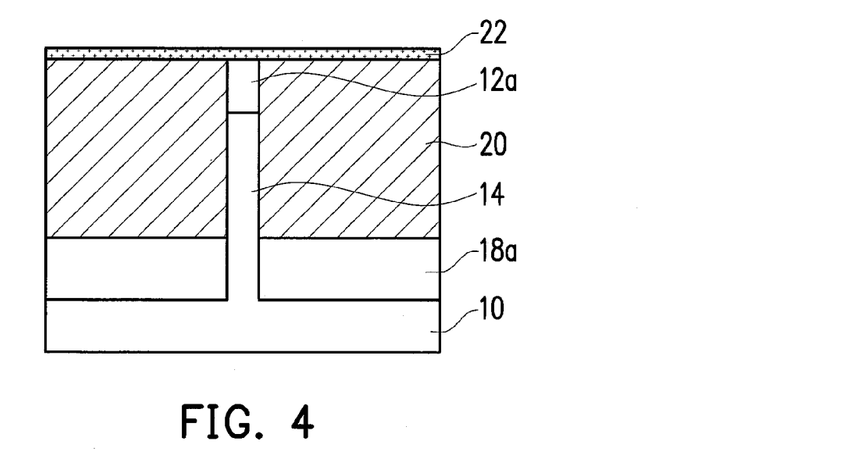

Referring to FIG. 4, the conductive material layer 20 is planarized, possibly by CMP, using the patterned hard mask 12a as a stop layer. Another hard mask material layer 22 is then formed over the conductive material layer 20. The hard mask material layer 22 may be a single material layer or include two or more material layers. In an embodiment, the layer 22 may include a silicon dioxide ($SiO_2$) layer, a silicon nitride (SiN) layer, a silicon carbide (SiC) layer, a silicon carbonitride (SiCN) layer, or a combination thereof, may be formed by CVD, and may be 50-1000 angstroms thick.

Referring to FIGS. 5 & 5A, lithography and etching processes are performed to pattern the hard mask material layer 22 and the conductive material layer 20 into a patterned hard mask 22a and a gate conductive layer 20a, respectively. The gate conductive layer 20a extends in a second direction that is substantially perpendicular to the first direction in which the fin structure 14 extends, and clips the fin structure 14. More specifically, the fin structure 14 is located between two portions of the gate conductive layer 20a.

Referring to FIGS. 6 & 6A, a first implant process 24 is performed using the first patterned hard mask 12a as a mask to form first S/D extension regions 26 in sidewalls of the fin structure 14. Another implant process is then performed to form first pocket doped regions. The first implant process 24 has an implant angle $\theta_1$ larger than 30°, possibly 30°-60°.

Figure 7A:
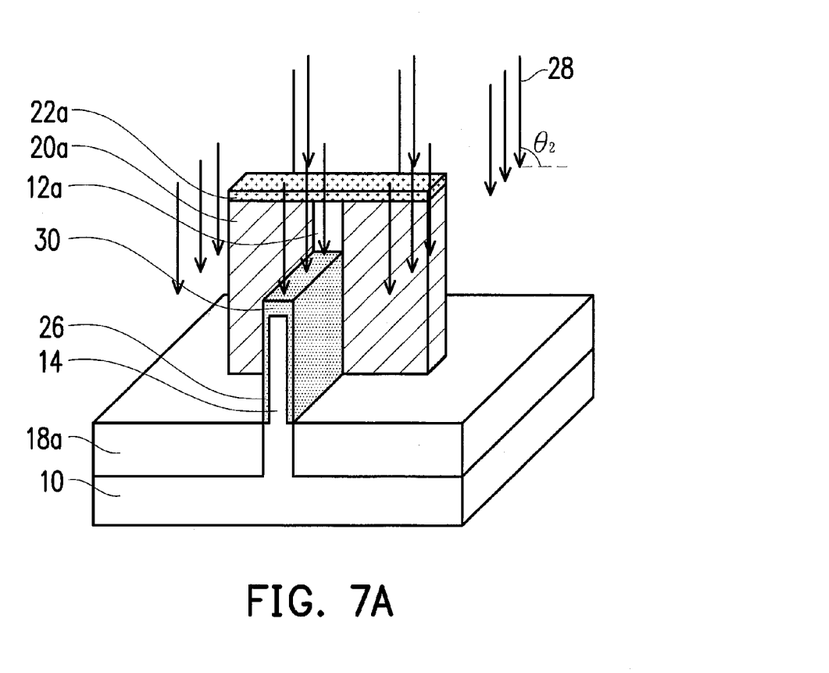

Referring to FIGS. 7 & 7A, the patterned hard mask 12a is removed to expose the top of the fin structure 14, possibly by an etching process, such as a dry or wet etching process. In an embodiment where the patterned hard mask 12a includes a $SiO_2$ layer and a SiN layer thereon, the removal process may include removing the SiN layer with the $SiO_2$ layer as an etching stop layer and then removing the $SiO_2$ layer.

A second implant process 28 is then performed to form second S/D extension regions 30 in the top of the fin structure 14. Another implant process is then performed to form second pocket doped regions (not shown). The second implant process 28 has an implant angle $\theta_2$ of 90° substantially. The second S/D extension regions 30 have a conductivity type that is the same as that of the first S/D extension regions 26 but different from that of the first and second pocket doped regions. In an embodiment, the first and second S/D extension regions 26 and 30 are of p-type, and the first and second pocket doped regions are of n-type. In another embodiment, the first and second S/D extension regions 26 and 30 are of n-type and the first and second pocket doped regions are of p-type. The p-type dopant can be boron or boron difluoride. The n-type dopant can be phosphorus or arsenic.

A spacer is then formed on the sidewalls of the gate conductive layer 20a. An etching process is then performed to remove a portion of the fin structure and form two recesses in the substrate 10 at both sides of the spacer. In an embodiment, the recesses may have a depth of hundreds of angstroms. The shape of each recess is not particularly limited, and may be a diamond shape or a rectangular shape. A semiconductor compound layer is then formed in each recess. The semiconductor compound may be an IV-IV semiconductor compound, which may include a first IV-group element and a second IV-group element. It is possible that the first IV-group element is silicon and the second IV-group element is germanium or carbon; i.e., the IV-IV semiconductor compound is SiGe or SiC. The semiconductor compound layer may be doped with a dopant.

In a PMOS device, the semiconductor compound layer includes SiGe and is p-doped possibly with boron or boron difluoride. In NMOS device, the semiconductor compound layer includes SiC and is n-doped possibly with P or As.

Then, an implant process is performed to dope the semiconductor compound layer and form S/D regions. The conductivity type of the S/D regions is the same as that of the $1^{st}$ and $2^{nd}$ S/D extension regions 26 and 30. In an embodiment, the S/D regions are p-doped, wherein the p-type dopant can be boron or boron difluoride. In another embodiment, the S/D regions are n-doped, wherein the n-type dopant can be phosphorus or arsenic.

Afterwards, an etching stop layer and a dielectric layer are formed over the substrate 10. The material of the etching step layer is different from that of the dielectric layer, for the etching stopping in the later etching step of the dielectric layer. The etching step layer may include SiN or SiON, may be formed by CVD, and may have a thickness of 50-1000 angstroms. The dielectric layer may include SiO, may be formed by CVD and may have a thickness of 1000-5000 angstroms.

Then, a portion of the dielectric layer and a portion of the etching stop layer are removed to expose the gate conductive layer 20a. This may be done by performing CMP to the etching stop layer and the dielectric layer with the gate conductive layer 20a as a stop layer. The gate conductive layer 20a is then removed to form an opening. A dielectric layer, a work-function metal layer and a metal layer are sequentially formed over the insulating layer in the opening. The dielectric layer may include a high-K material with a K-value greater than 4, such as hafnium oxide ($HfO_2$), hafnium silicon oxide (HfSiO), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), or hafnium zirconium oxide (HfZrO). The work-function metal layer may include Ti, Ta, TiN, TaN, TiC, Ti—Al alloy, or a combination thereof. The metal layer may include Al, Cu, W, Ti, Ta or an alloy thereof, and may be formed by CVD or sputtering.

Next, a portion of the metal layer, a portion of the work-function metal layer and a portion of the dielectric layer are removed to form a gate metal layer, a work-function metal layer and a gate dielectric layer. The removal process may utilize CMP or etching-back.

Though the high-K dielectric layer is formed after the opening is formed in the above process, this invention is not limited thereto. If a gate dielectric layer with a high dielectric constant (K>4) is formed on the fin structure 14 before the conductive material layer 20 is formed (FIG. 3), it is not necessary to form the high-k (k>4) dielectric layer.

FIGS. 8-11 illustrate, in a side view along the first direction, a method for fabricating a MOS device according to another embodiment of this invention. FIGS. 9A-11A are perspective views of the structures shown in FIGS. 9-11.

Referring to FIGS. 1-3, a fin structure 14, a patterned hard mask 12a, an insulating layer 18a and a conductive material layer 20 are formed as above.

Figure 8:
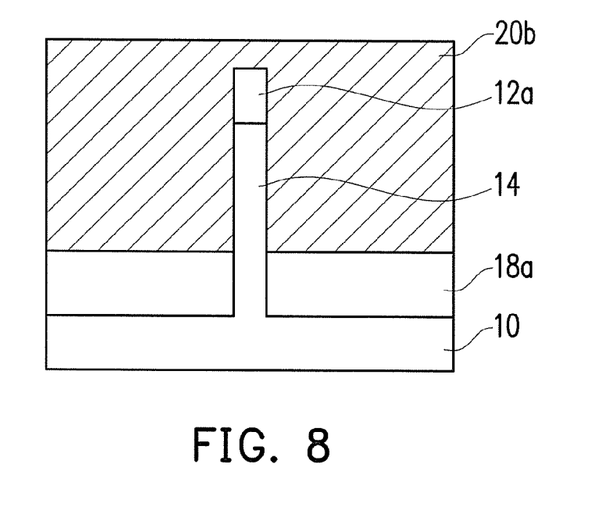
FIGS. 8-11 illustrate, in a side view along the first direction, a method for fabricating a MOS device according to another embodiment of this invention.

Referring to FIG. 8, the conductive material layer 20 is planarized in a manner such that the top surface of the remaining conductive material layer 20b is higher than that of the patterned hard mask 12a.

Figure 9:
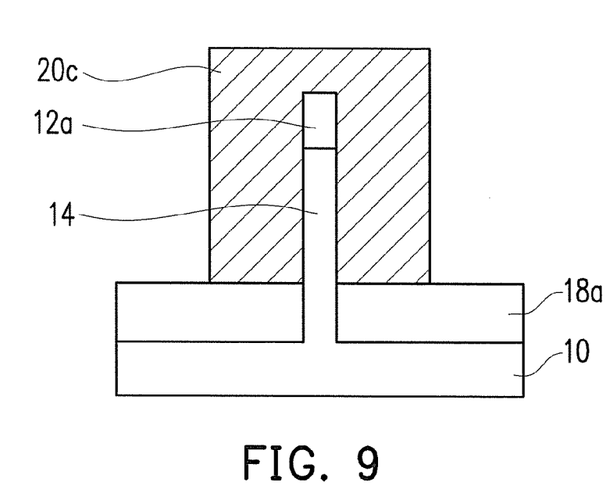
Figure 9A:
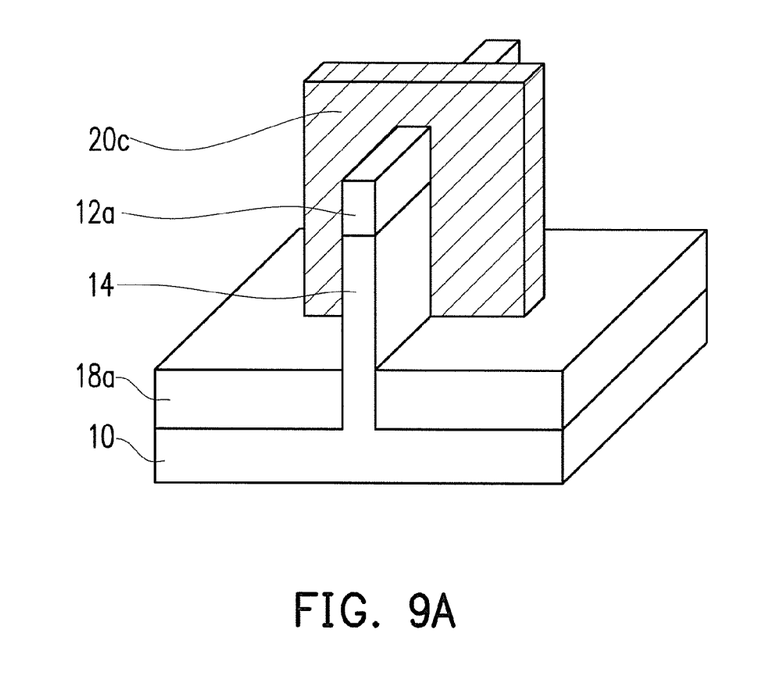

Referring to FIGS. 9 and 9A, the remaining conductive material layer 20b is patterned through lithography and etching to form a gate conductive layer 20c.

Figure 10:
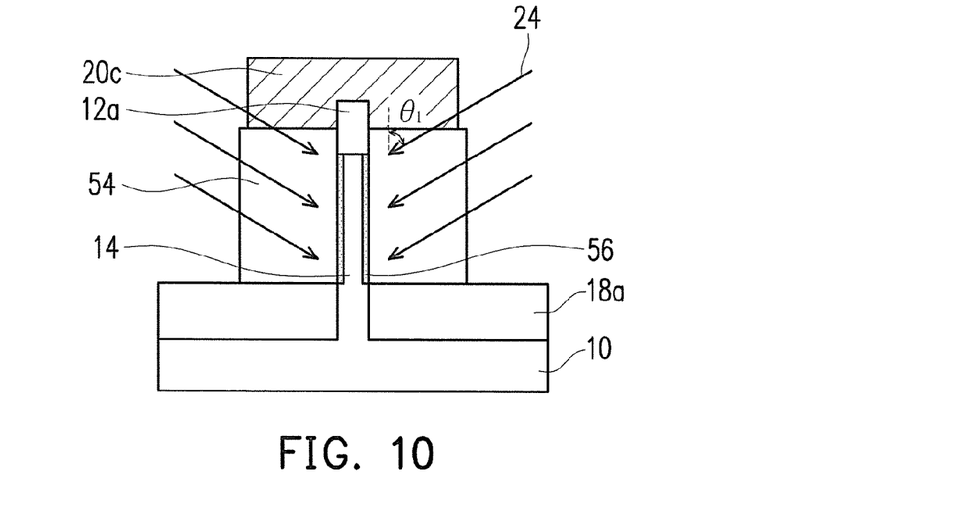
Figure 10A:
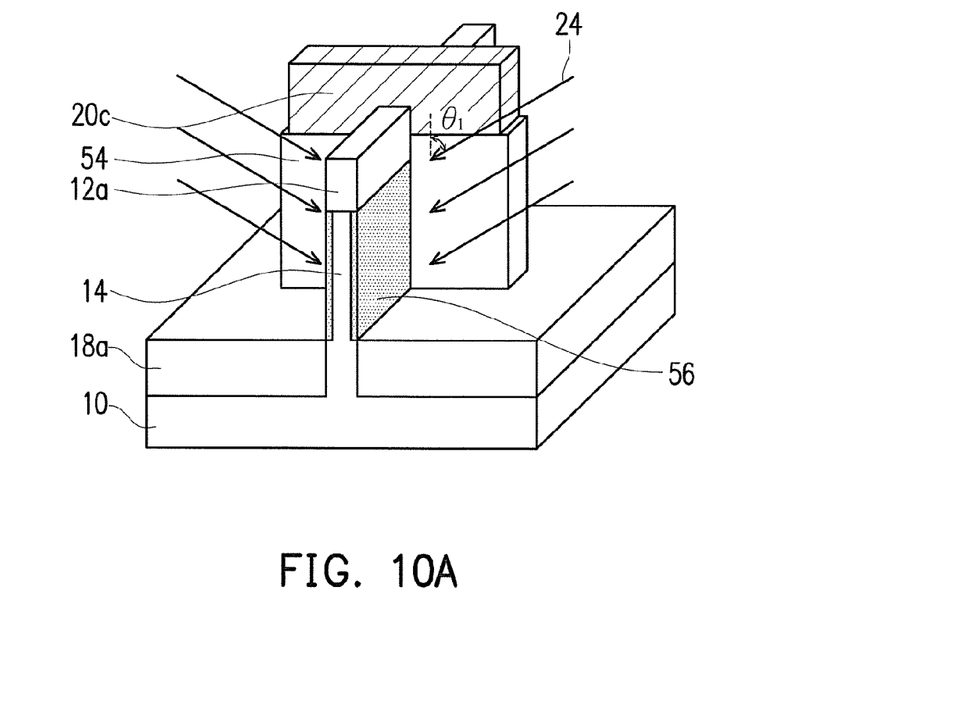
Figure 11:
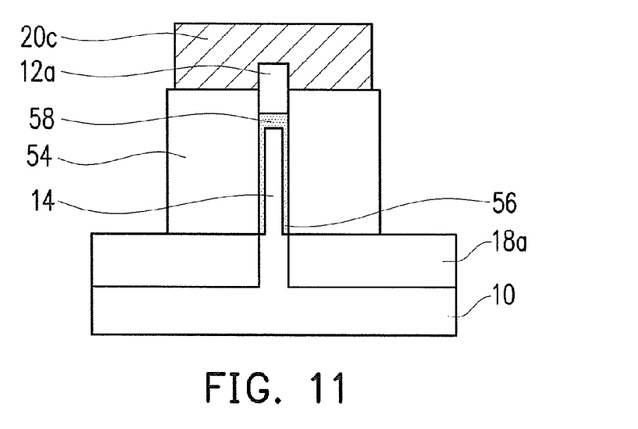
Figure 11A:
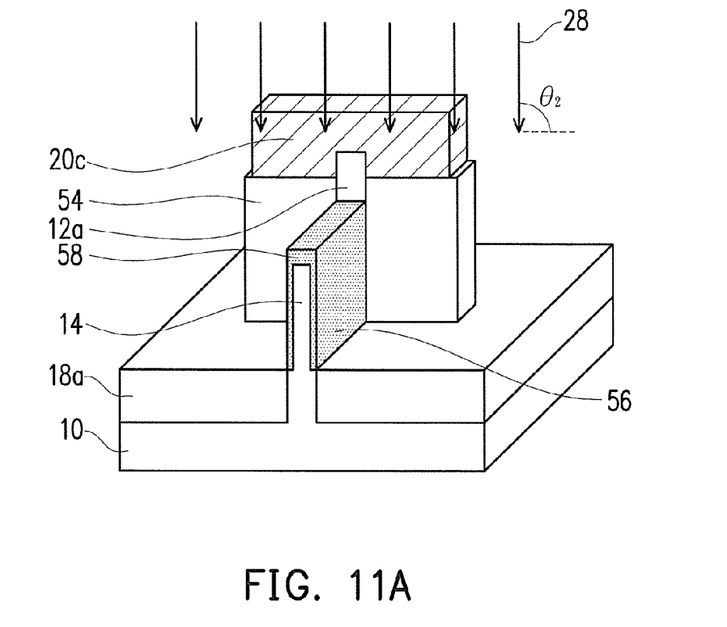
Figure 12:
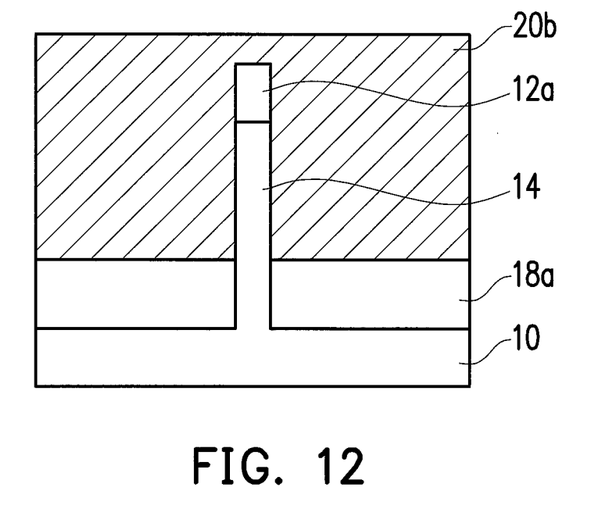
Figure 13:
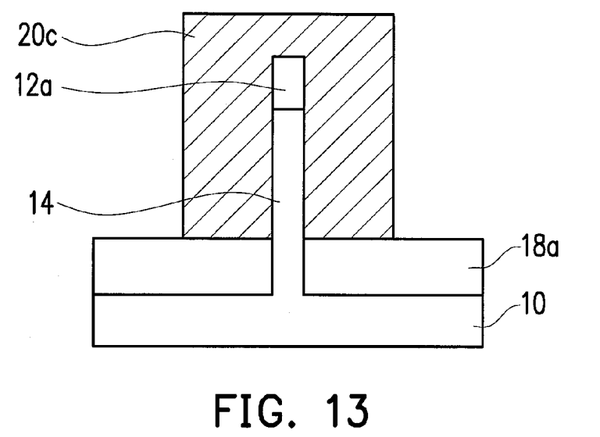
Figure 13A:
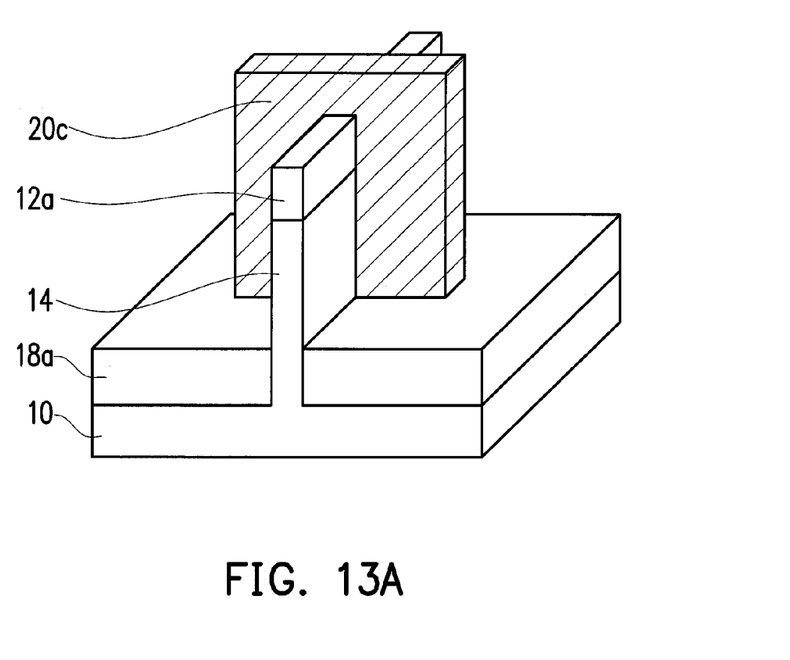
Figure 14:
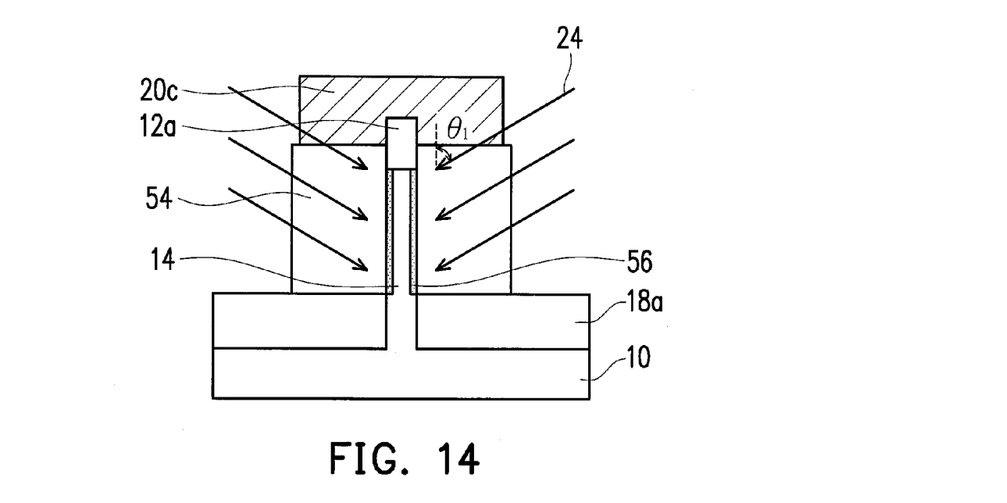
Figure 14A:
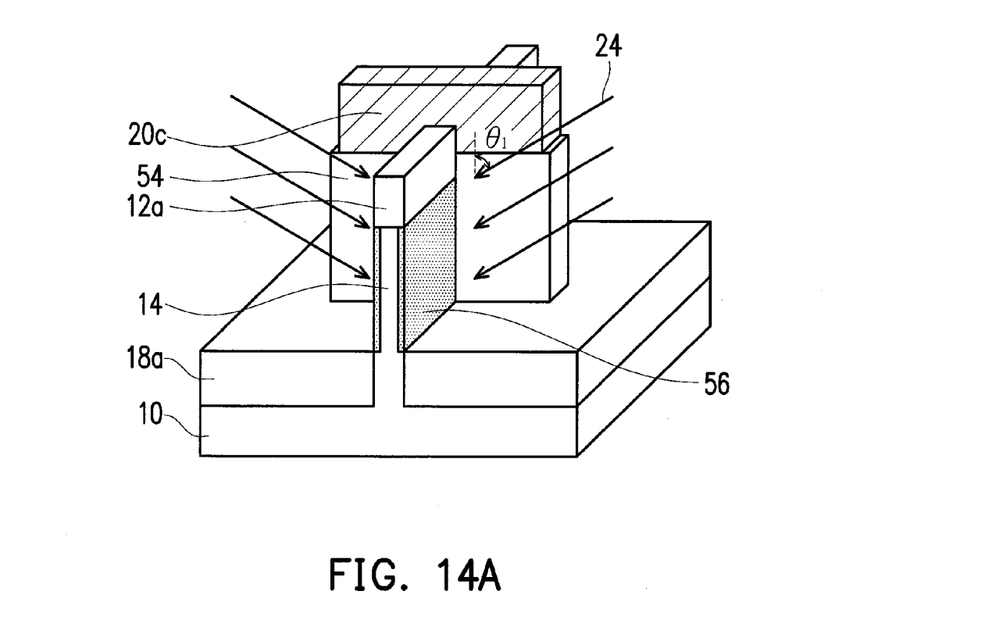
Figure 15:
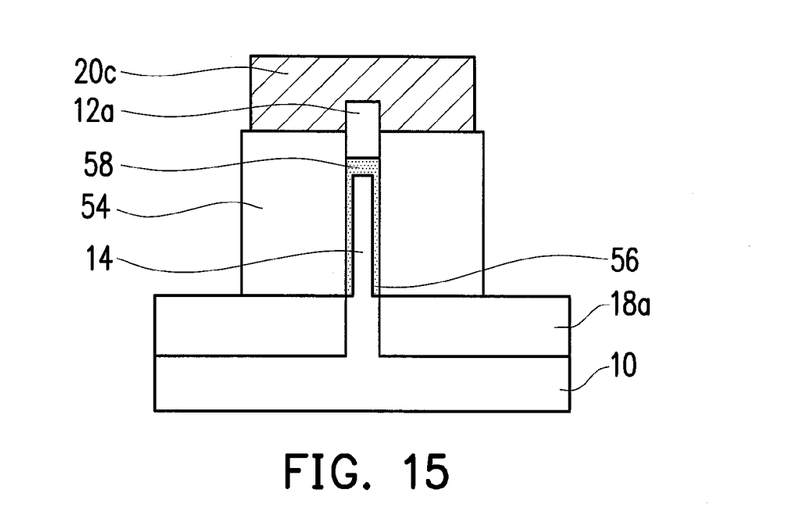
Figure 15A:
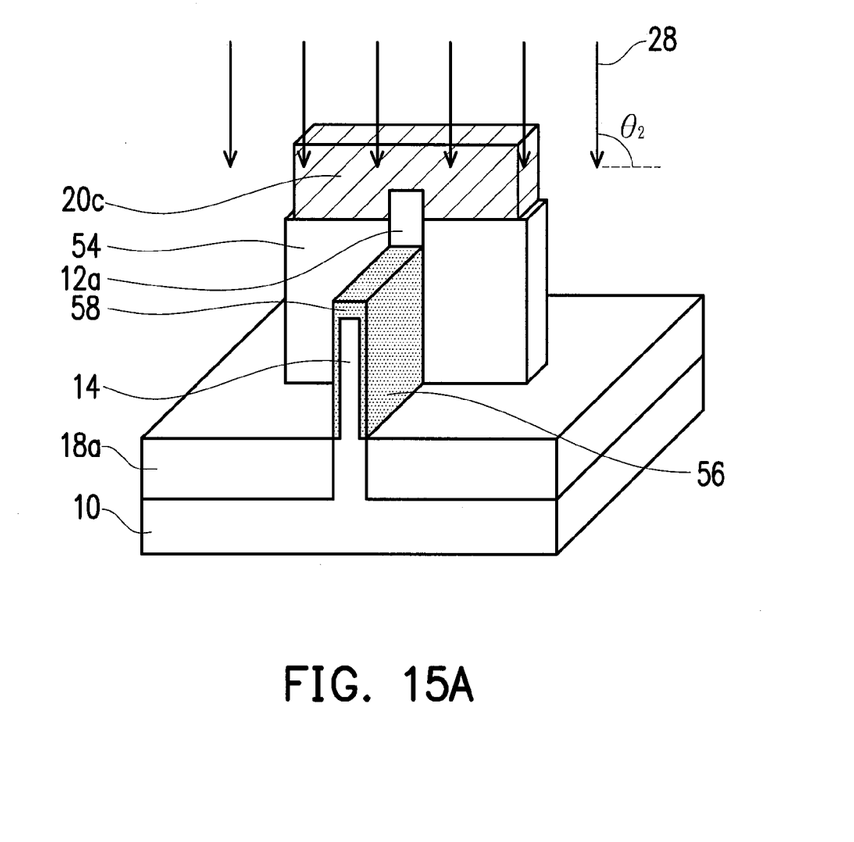

Referring to FIGS. 10 and 10A, a spacer 54 is formed around the gate conductive layer 20c, possibly by forming a substantially conformal spacer material layer and then performing an anisotropic etching process. The spacer material layer may include SiN or $SiO_2$, and may be formed by CVD or thermal oxidation.

Then, a first implant process 24 is performed using the patterned hard mask 12a and the spacer 54 as a mask to form first S/D extension regions 56 in the sidewalls of the fin structure 14. Another implant process is then performed to form first pocket doped regions (not shown). The first implant process 24 has an implant angle larger than 30°, possibly 30°-60°. Because the spacer 54 is disposed around the gate conductive layer 20c, the distance (channel length) between the first S/D extension regions 56 in this embodiment is larger than that between the first S/D extension regions 26 in the precedent embodiment.

The patterned hard mask 12a is then removed as shown in FIG. 7/7A to expose the top of the fin structure 14, and then a second implant process 28 is performed to form second S/D extension regions 58 in the top of the fin structure 14. Another implant process is then performed to form second pocket doped regions (not shown). The $2^{nd}$ implant process 28 has an implant angle of 90° substantially. For the spacer 54 is disposed around the gate conductive layer 20c, the distance (channel length) between the second S/D extension regions 58 in this embodiment is larger than that between the second S/D extension regions 30 in the precedent embodiment.

The subsequent fabricating steps have been described above and are not described again.

As mentioned above, this invention performs two implant processes to form S/D extension regions in different surfaces of the fin structure, and may further perform two halo implant processes to form pocket doped regions in the different surfaces. In the first implant process and first halo implant process, the surface of the fin structure is covered by the first patterned hard mask so that the top of the fin structure is not implanted and only the sidewalls of the same are implanted to form first S/D extension regions and first pocket doped regions. The top of the fin structure is later implanted to form second S/D extension regions in the second implant process and form second pocket doped regions in the second halo implant process after the first implant process and the first halo implant process are performed and the first patterned hard mask is removed. Since the implanted regions in the first (halo) implant process and the second (halo) implant process are different and the doses of the two processes can be controlled independently, the S/D extension regions (and the pocket doped regions) each can be formed in a uniform dopant concentration and a uniform depth. Moreover, the implant angle of the first implant process is not much limited, so that the process margin thereof can be improved.

Accordingly, the method of this invention allows a MOS device (FinFET) having a 3D structure and a uniform dopant concentration to be form, includes a simple process with a large process margin, and does not much increase the manufacturing cost.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for fabricating a MOS device, comprising:
    forming a first hard mask layer over a semiconductor substrate;
    patterning the first hard mask layer and removing a portion of the substrate to form a first patterned hard mask and a fin structure surrounded by a trench, wherein the fin structure extends in a first direction;
    forming an insulating layer at a bottom of the trench;
    forming, on the insulating layer in the trench, a gate conductive layer that extends in a second direction;
    performing a first implant process with the first patterned hard mask as a mask to form first source/drain extension regions in sidewalls of the fin structure;
    removing the first patterned hard mask to expose a top of the fin structure; and
    after removing the first patterned hard mask and before forming a spacer on the gate conductive layer, performing a second implant process to form second source/drain extension regions in the top of the fin structure while a sidewall of the gate conductive layer is exposed,
    wherein an implant angle of the first implant process is within the range of 30° to 60° with respect to a normal line to a surface of the semiconductor substrate on which the gate conductive layer is formed.

2. The method of claim 1, wherein forming the gate conductive layer comprises:
    forming a conductive material layer on the insulating layer in the trench;
    planarizing the conductive material layer using the first patterned hard mask as a stop layer;
    forming a second hard mask layer on the conductive material layer; and
    patterning the second hard mask layer and the conductive material layer into a second patterned hard mask and the gate conductive layer, respectively.

3. The method of claim 1, wherein forming the gate conductive layer comprises:
    forming a conductive material layer on the insulating layer in the trench;
    planarizing the conductive material layer, wherein a top surface of the remaining conductive material layer is higher than a top surface of the first patterned hard mask; and
    patterning the conductive material layer into the gate conductive layer.

4. The method of claim 3, further comprising: forming a first spacer around the gate conductive layer before the first implant process is performed.

5. The method of claim 1, wherein forming the insulating layer comprises:
    forming an insulating material over the substrate;
    planarizing the insulating material using the first patterned hard mask as a stop layer; and
    removing a portion of the insulating material remaining in the trench.

6. The method of claim 1, wherein an implant angle of the second implant process is substantially 90° with respect to the surface of the semiconductor substrate.

7. The method of claim 1, wherein the first implant process forms the first source/drain extension regions in sidewalls along the first direction of the fin structure.

8. The method of claim 1, wherein an implant angle of the first implant process and the implant angle of the second implant process with respect to a normal line to a surface of the semiconductor substrate on which the gate conductive layer is formed are different.

* * * * *